United States Patent [19]

Coppa et al.

[11] Patent Number: 4,934,819

[45] Date of Patent: Jun. 19, 1990

[54] APPARATUS FOR MEASURING TRANSVERSE MOMENT OF AN ELECTROMAGNETIC FIELD ASSOCIATED WITH AN OPTICAL BEAM

[75] Inventors: Gianni Coppa, Asti; Pietro Di Vita; Umberto Rossi, both of Turin, all of Italy

[73] Assignee: CSELT - Centro Studi E Laboratori Telecomunicazioni S.p.A., Turin, Italy

[21] Appl. No.: 669,606

[22] Filed: Nov. 8, 1984

[30] Foreign Application Priority Data

Nov. 10, 1983 [IT] Italy .............................. 68171 A/83

[51] Int. Cl.$^5$ ................................................ G01J 1/00
[52] U.S. Cl. ..................................... 356/73.1; 356/121
[58] Field of Search .................... 356/73.1, 237, 121, 356/225, 73.1, 336; 364/524, 525, 822, 837

[56] References Cited

U.S. PATENT DOCUMENTS

| | | | |
|---|---|---|---|
| 2,179,000 | 11/1939 | Tea | 364/837 |
| 2,839,149 | 6/1958 | Piety | 364/822 |
| 3,910,687 | 10/1975 | Iwata | 356/367 |
| 4,037,964 | 7/1977 | Werthermer et al. | 356/336 |
| 4,349,276 | 9/1982 | Di Vita | 356/73.1 |
| 4,501,492 | 2/1985 | Douklias | 356/73.1 |

FOREIGN PATENT DOCUMENTS 2133540 7/1984 United Kingdom .............. 356/73.1

OTHER PUBLICATIONS

Cutrona et al., "Optical Data Processing and Filtering Systems", *IRE Transactions on Information Theory*, Jun. 1960, pp. 386-400.

Kitayama et al., "Determination of Mode Power Distribution in a Parabolic-Index Optical Fibers Theory and Application", IEEE Journal of Quantum Electronics, vol. QE-15, No. 10, Oct. 1979, pp. 1161-1165.

Brinkmeyer, "Spot Size of Graded-Index Single-Mode Fibers: Profile-Independent Representation and New Determination Method", Applied Optics, vol. 18, No. 6, Mar. 15, 1979. pp. 932-937.

Yamauchi et al., "Spot-Size of Single Mode Fibres with a Noncircular Core", IOOC '83, Tokyo, Japan, Jun. 27-30, 1983, Paper 28A2-3, pp. 39-41.

Millar, "Direct Method of Determining Equivalent Step Index Profiles for Multimode Fibres", Electronics Letters, vol. 17, No. 13, Jun. 25, 1981, pp. 458-460.

Alard et al., "Fundamental Mode Spot-Size Measurement in Single-Mode Optical Fibres", Electronics Letters, vol. 17, No. 25, Dec. 10, 1981, pp. 958-960.

*Primary Examiner*—Richard A. Rosenberger
*Attorney, Agent, or Firm*—Herbert Dubno

[57] ABSTRACT

The value of a transverse moment of any order of the electromagnetic field associated with an optical beam (and in particular the spot-size of such a beam) is determined by two successive measurements of the optical power of the beam: one measurement is a direct measurement, the other is effected after spatially modulating the transverse distribution of the electromagnetic field by a factor proportional to the n-th power of the transverse coordinate of the beam, n being the moment order. The moment can be obtained from the ratio between the two measurements. The invention includes also the apparatus for carrying out the method.

7 Claims, 1 Drawing Sheet

APPARATUS FOR MEASURING TRANSVERSE MOMENT OF AN ELECTROMAGNETIC FIELD ASSOCIATED WITH AN OPTICAL BEAM

FIELD OF THE INVENTION

The present invention relates to for optical measurements and, more particularly to a method of and an apparatus for measuring the tranverse moment of the electromagnetic field associated with an optical beam. Preferably, but not exclusively, the invention can be applied to spot-size evaluation in an optical fiber, i.e. to measurement of the 2nd-order moment of the output near or far field of such a fiber.

BACKGROUND OF THE INVENTION

It is known that the generic n-th order moment (n being an integer and positive member) of the electromagnetic field of an optical beam is given, in polar coordinates, by the relation:

$$M_n = \frac{\int_0^\infty \int_0^{2\pi} q^n I(q,\phi) q \, dq \, d\phi}{\int_0^\infty \int_0^{2\pi} I(q,\phi) q \, dq \, d\phi} \quad (I)$$

where I is the electromagnetic-field spatial intensity, q and $\phi$ are the transverse polar coordinates with origin on the beam axis; q can be the radius (for the near-field) or the angular coordinate (for the far-field).

More particularly, the square root $W_0$ of the 2nd order moment, i.e. the root mean square of the spatial distribution of the beam electromagnetic field (or of the field at the output of an optical fiber, in the preferred application) represents the beam spot-size.

The knowledge of $W_0$ is important for the knowledge of the geometric dimensions of the field, which give information both on the collimation of and on the power distribution in the beam.

In the particular case of the optical fibers (to which reference will be made hereinafter since the invention has been mainly developed for application in this field) the spot-size knowledge gives information on propagation properties inside the fiber and on splice losses; this information is indispensable when optical fibers are used in a telecommunications system. Even more particularly, spot sizes both in the near- and in the far-field characterize monomode fibers. In fact splice and bending losses, and cabling losses due to microbending can be obtained from these parameters. Spot-size variation versus wavelength gives cut-off wavelength of the first higher order mode and also the waveguide dispersion.

A number of different techniques have been proposed for spot size measurement in optical fibers.

One of them has been described by R. Yamauchi, T. Murayama, Y. Kikuchi, Y. Sugawara e K. Inada in the paper "Spot-sizes of single mode fibers with a noncircular core" presented at the Fourth International Conference on Integrated Optics and Optical Fiber Communication (IOOC '83, Tokyo, Japan, 27-30 June 1983, paper 28A2-3, pages 39 and ff.). According to this method, spot-size is obtained by determining the value of the intensity I at the fiber at the output by near-field intensity scanning and then by directly applying relation (I), with n=2. This method can be used for measuring moments of any order.

Since the integration interval extends to infinity, but beyond a determined distance from the beam axis the intensity is masked by measurement noise, the method can introduce significant errors into the value calculated. In addition, radial scanning is complex per se.

According to other methods a Gaussian distribution is assumed for the function representing the intensity I and quantities are measured which can be correlated to spot-size by means of formulae, which are valid only if the hypothesis of Gaussian field is satisfied. Examples of such methods are described in the papers: "Direct method of determining equivalent-step-index profiles for multimode fibers" by C. A. Millar, Electronics Letters, Vol. 17, No. 13, June 25, 1981, pp 458 and ff., and "Fundamental mode spot-size measurement in single-mode optical fibers" by F. Alard, L. Jeunhomme, P. Sansonetti, Electronics Letters, Vol. 17, N.25, Dec. 10, 1981, pp. 958 and ff.

Since the hypothesis of Gaussian field applies only in very particular cases, the measurements obtained by these methods present an intrinsic lack of accuracy difficult to be quantized.

SUMMARY OF THE INVENTION

To overcome these disadvantages, the invention provides a method allowing the accurate determination of transverse moments of any order, and in particular of the spot-size, by directly applying the relation (I), but without the need for complicated measurements requiring transverse scanning of the intensity, or numeric computation of integrals, or of approximation hypotheses as to on the field distribution.

This method is characterized in that, for the determination of the generic n-th order moment, two successive measurements of the optical beam power are made, the first being a direct measurement, the other being effected, under the same conditions of beam emission as the first measurement, by spatially modulating the transverse distribution of the electromagnetic field by a factor proportional to the n-th power of the transverse beam coordinate; and the moment is obtained from the ratio between such measurements.

The direct measurement of the beam power corresponds to the denominator of relation (I), and the measurement of the same power, radially modulated by a factor proportion to $q^n$, gives the numerator of relation (I).

The value of $M_n$ and/or $W_0$ is easily derived from the two measurements.

A suitable mask or spatial filter, coaxial with the beam and having a transmittivity proportional to $q^n$, is used for spatial modulation. This could be obtained by an azimuthally symmetrical mask (e.g. a grey distribution, whose transmittivity is null at the center and maximum at the edges).

When the field intensity is azimuthally symmetric (as in the case of a monomode fiber), a simpler implementation of the method can be obtained by using a mask which is composed only of perfectly opaque and perfectly transparent zones, but which is not azimuthally symmetrical. More particularly, the mask will be opaque at the center and the area of the transparent zone will increase and the area of the opaque zones will decrease with the distance from the center, in such a way that, along any infinitesimal annulus, the ratio between the two surfaces is proportional to the n-th power of the annulus radius on the mask. In the case of a circular mask, the opaque zone or zones (one or more of which is provided according to the requirements) can be delimited each by an arc of a spiral of the kind $\phi=kr^n$ (where q is the azimuthal coordinate, r the projection of transverse coordinate q on the mask plane, and k is a constant), having the origin in the mask center and ending at a suitable point of the mask edge, and by the radius passing in such a point. Advantageously, pairs of opaque zones can be joined along said radius.

For measurements of near-field moments the mask should be placed in an image plan.

The present invention includes also the apparatus for implementing this method.

BRIEF DESCRIPTION OF THE DRAWING

The invention will become more apparent with reference to the annexed drawing in which.

SPECIFIC DESCRIPTION

Figure 1:
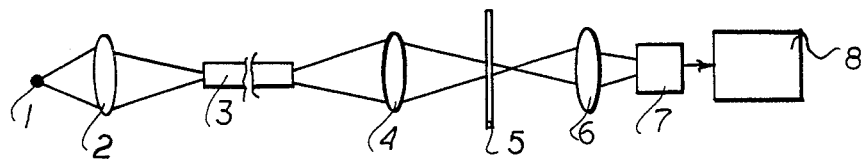
FIG. 1 shows an apparatus for carrying out the method in the particular case of measurement of the near-field spot-size of an optical-fiber.

As can be seen from FIG. 1, the light from an optical source 1 of suitable wavelength is collected by an optical system schematically represented by lens 2 and excites the input of an optical-fiber trunk 3, whose near-field spot-size is to be measured. The light outgoing from fiber 3 is collected by a second optical system, schematically represented by lens 4, which forms an image of the fiber output face on an image plane. If necessary, the image is magnified.

The support (not shown) for a spatial filter 5 is placed at such image plane. Filter 5 is adapted to modulate the near-field intensity of the electromagnetic field outgoing from fiber 3 by a factor proportional to the square of the distance from the beam axis. The support is to allow an easy insertion of mask 5 along the path of the beam outgoing from the fiber, coaxially with said beam, and an easy removal of the mask from the path itself. In addition it should allow the mask shifts in the two directions perpendicular to that of propagation of the beam, necessary to the proper location of the mask itself.

The optical power present on the image plane is then transferred, e.g. by a third optical system 6, onto a photodetector 7 associated with a measuring and computing system 8. To obtain the spot-size two successive measurements of the power transmitted by fiber 3 are required as may be the one with mask 5 coaxially inserted along the trajectory of the beam outgoing from fiber 3, and the other without mask 5. The two power values correspond, as mentioned, to the numerator and denominator of relation (I).

Measuring system 8 detects the intensity of the electrical signal supplied by photodetector 7 for the two measurements and calculates the square root of the ratio between the two values. The actual spot-size is obtained by multiplying said ratio by a metric factor which takes into account both the magnification introduced by the optical system 4 and the mask dimensions: such metric factor is basically given by the ratio between the size of mask 5 and the magnification due to the optical system 4.

The very same apparatus can be used also for measuring the spot-size in the far-field. In this case, lens 4 need not to be inserted, since no image has to be formed, and the mask 5 is to be inserted coaxially to the beam in the far field region.

Possible embodiments of mask 5 are shown in FIGS. 2-7, still in the case of near-field spot-size measurement.

Figure 2:
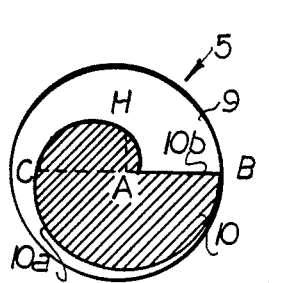
FIGS. 2 to 7 represent masks for the spatial modulation of the radial distribution of the beam.

In FIG. 2 mask 5 is a disk which presents a transparent zone 9 and an opaque zone 10 delimited by radius 10b and by an arc 10a of a spiral of the family $\phi=kr^2$ (e.g. a Fermat's spiral) having the origin at center A of the disk and ending at the same point B of the disk edge where radius 10b ends. The material used for the two zones obviously depends on the wavelengths used in the measurements; for the case of measurements on optical fiber 3, mask 5 might be a quartz disk on which a metal layer with null transmittivity has been deposited, said layer having the desired edge shape.

Figure 3:
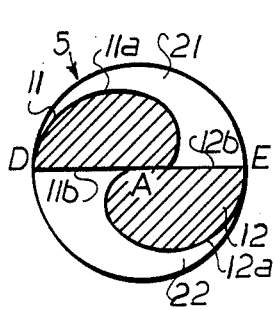

Mask 5 in FIG. 3 is a disk presenting two equal opaque sectors or lobes 11, 12, each delimited by an arc 11a, 12a of a spiral of the above mentioned type and by a radius 11b, 12b; the remaining areas 21, 22, delimited by radius 11b and arc 12a (or respectively 12b, 11a) are transparent. The spiral arcs have the origin in center A of the disk, and end at the edge of disk 5, at the same points D, E where radiuses 11b, 12b end. The shape of each opaque sector 11, 12 corresponds to that of the portion of the opaque zone 10 of FIG. 2 delimited by the spiral arc comprised between points A and C and by segment AC.

Figure 4:
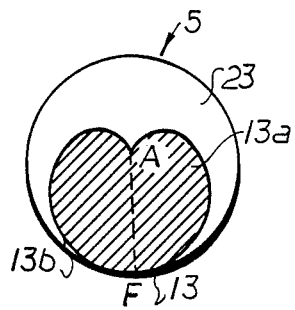

Sectors 11, 12, instead of being separate as in FIG. 3, could be joined along the radius. Thus, the opaque zone 13 shown in FIG. 4, is obtained, which zone is delimited by two spiral arcs 13a, 13b having the origin in center A and ending at a same point F of the edge. The remaining part 23 of the disk is transparent.

Figure 5:
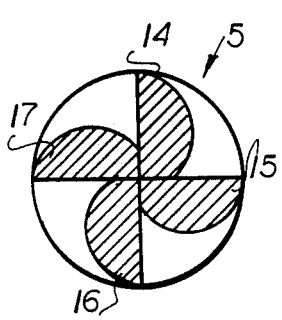
Figure 6:
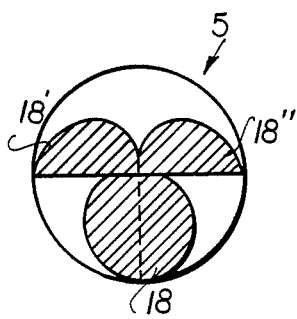
Figure 7:
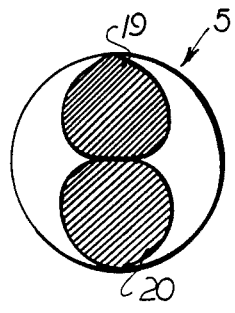

To facilitate the mask arrangement coaxially to the beam, a mask like that of FIGS. 5–7 can be manufactured. The mask comprises four opaque sectors or lobes 14, 15, 16, 17 each being a replica of that portion of the opaque zone of FIG. 2 delimited by arc AH and by segment AH. The four sectors can be separate (as shown in FIG. 5) or two of them could be joined along the radius (FIG. 6) forming three opaque zones, 18, 18', 18'' or still they could be joined two by two (FIG. 7) forming a mask with two opaque zones 19, 20 and two transparent zones.

By a mask of this kind the coaxial position is easily recognized by the fact that it renders the photodetector output signal extreme, as can be easily deduced.

Generally, a mask which is not azimuthally symmetric can be used, which mask is composed of one or more perfectly opaque sectors and one or more perfectly transparent sectors, such that along any infinitesimal annulus the ratio between the surfaces of the transparent and the opaque sectors is proportional to the square of the annulus radius. If a mask with a plurality of opaque sectors is used, their number ought to be small enough as to ensure a suitable accuracy of the sector shape and to avoid too great superpositions at the center.

The size of mask 5 ought to ensure a correct spatial modulation of the light beam outgoing from the fiber, what can be obtained if the field intensity at the mask edges is made negligible. For example, for near-field use, in the case of a spot size of 4 μm (which value is typical of a monomode optical fiber) and with a magnification of 50 times, the mask radius could be of the order of 1 mm. For far-field use even larger masks could be used, so that no manufacturing problem arises.

What has been previously stated for spot size measurements can be directly applied to the measurements of the moments of any order n; obviously in this case the arcs delimiting the opaque mask sectors will be other arcs of spirals of the family $\phi = kr^n$.

In case of measurements on a generic optical beam, that beam will be transferred by a suitable optical system directly on the plane of the mask support.

We claim:

1. An apparatus for measuring a transverse moment of an electromagnetic field associated with an optical beam for each value n of order of said moment, comprising:

means for emitting an optical beam of a given wave length;

first collecting means in the path of said beam for exciting the input of an optical-fiber trunk having a near-field spot-size to be measured;

second collecting means in the path of said beam outgoing from an output end of said trunk for collecting the light thereof and focusing an image of said image of said output end of said optical-fiber trunk on an image plane disposed along an axis of said beam;

a mask having an outer peripheral edge and a center and removably positioned coaxial with said axis in the path of said beam for spatially modulating same and located at said image plane, said mask comprising at least one opaque zone beginning at the center of said mask and ending at a point along said edge of said mask and delimited by a continuous curve running from the center to the edge whose equation in polar coordinates is $\phi = kr^n$, r is a radius, n is a power of the radius corresponding to the order of the transverse moment to be determined, k is a proportionality factor, and $\phi$ is the angle of said radius, said opaque zone occupying only a portion of the area of said mask so that at least one corresponding transparent zone forms the remainder of the area of said mask, said opaque zone decreasing in area and a corresponding transparent zone increasing in area with the distance from said center in such relationship that, along any infinitesimal annulus coaxial with said center, the ratio between the areas of said opaque and transparent zones for a given value of a transverse coordinate q of said beam, whose projection on the mask plane associated with a radius of a corresponding infinitesimal annulus is proportional to $q^n$, this proportion being unique for all points of said mask with a common transverse coordinate q;

third collecting means in the path of said beam outgoing from said mask and transferring an optical power present on the image plane and passed by said transparent zone onto a photodetector for converting the optical power passed onto said photodetector into electrical signals; and a measuring system connected to said photodetector for forming a quotient of the powers detected by said photodetector with and without said mask in the path of said beam to provide a measure of said transverse moment, said mask having at least two of said opaque zones forming respective geometrically similar lobes, each of which is delimited by a respective said curve extending from said center and running to the periphery of said mask.

2. The apparatus defined in claim 1 wherein each of said opaque zones is further delimited by respective radii extending along a common diameter of said mask.

3. The apparatus defined in claim 1 wherein said opaque zones join one another along a common radius extending from said center to said point.

4. The apparatus defined in claim 1 wherein each of said opaque zones is further delimited by a second such curve extending from the center to a respective point associated with the respective opaque zone, the respective points of said opaque zones lying diametrically opposite one another along said periphery.

5. The apparatus defined in claim 1 wherein said mask has four opaque zones, each of which lies in a respective quadrant of said mask and is delimited by a respective said curve extending from said center to a respective said point on said periphery and by a respective radius from said center to the respective point.

6. The apparatus defined in claim 1 wherein said mask is provided with a further opaque zone delimited by a pair of said curves each extending from the center to a common point along said periphery.

7. An apparatus for measuring a transverse moment of an electromagnetic field associated with an optical beam for each value n of order of said moment, comprising:

means for emitting an optical beam of a given wave length;

a collecting means in the path of said beam for exciting the input of an optical-fiber trunk having a transverse moment to be measured;

a mask having an outer peripheral edge and a center and removably positioned coaxial with an axis of the beam in the path of said beam for spatially modulating same and located at said image plane, said mask comprising at least one opaque zone beginning at the center of said mask and ending at a point along said edge of said mask and delimited by a continuous curve running from the center to the edge whose equation in polar coordinates is $\phi = kr^n$, r is a radius, n is a power of the radius corresponding to the order of the transverse moment to be determined, k is a proportionality factor, and $\phi$ is the angle of said radius, said opaque zone occupying only a portion of the area of said mask so that at least one corresponding transparent zone forms the remainder of the area of said mask, said opaque zone decreasing in area and a corresponding transparent zone increasing in area with the distance from said center in such relationship that, along any infinitesimal annulus coaxial with said center, the ratio between the areas of said opaque and transparent zones for a given value of a transverse coordinate q of said beam for a corresponding infinitesimal annulus is proportional to $q^n$, this proportion being unique for all points of said mask with a common transverse coordinate q;

further collecting means in the path of said beam outgoing from said mask and transferring an optical power present on the image plane and passed by said transparent zone onto a photodetector for converting the optical power passed onto said photodetector into electrical signals; and a measuring system connected to said photodetector for forming a quotient of the powers detected by said photodetector with and without said mask in the path of said beam to provide a measure of said transverse moment, said mask having at least two of said opaque zones forming respective geometrically similar lobes, each of which is delimited by a respective said curve extending from said center and running to the periphery of said mask.

* * * * *